US008921880B2

(12) United States Patent
Hsu et al.

(10) Patent No.: US 8,921,880 B2
(45) Date of Patent: Dec. 30, 2014

(54) LIGHT EMITTING DIODE LIGHT SOURCE DEVICE

(71) Applicant: Advanced Optoelectronic Technology, Inc., Hsinchu, Hsien (TW)

(72) Inventors: Chih-Peng Hsu, Hsinchu (TW); Chung-Min Chang, Hsinchu (TW); Hsuen-Feng Hu, Hsinchu (TW); Chien-Lin Chang-Chien, Hsinchu (TW); Yu-Wei Tsai, Hsinchu (TW)

(73) Assignee: Advanced Optoelectronics Technology, Inc., Hsinchu Hsien (TW)

( * ) Notice: Subject to any disclaimer, the term of this patent is extended or adjusted under 35 U.S.C. 154(b) by 46 days.

(21) Appl. No.: 13/729,044

(22) Filed: Dec. 28, 2012

(65) Prior Publication Data

US 2013/0285094 A1    Oct. 31, 2013

(51) Int. Cl.
*H01L 33/50* (2010.01)
*H01L 33/56* (2010.01)
*H01L 33/54* (2010.01)

(52) U.S. Cl.
CPC .............. *H01L 33/50* (2013.01); *H01L 33/56* (2013.01); *H01L 33/505* (2013.01); *H01L 33/54* (2013.01); *H01L 2933/0091* (2013.01)
USPC ................ 257/98; 362/311.02; 362/311.06

(58) Field of Classification Search
USPC ........... 313/502; 362/311.06, 311.07, 311.08, 362/311.09, 311.1
See application file for complete search history.

(56) References Cited

U.S. PATENT DOCUMENTS

| | | | | |
|---|---|---|---|---|
| 6,155,699 A * | 12/2000 | Miller et al. | ................... | 362/293 |
| 6,204,523 B1 * | 3/2001 | Carey et al. | ...................... | 257/98 |
| 6,252,254 B1 * | 6/2001 | Soules et al. | ..................... | 257/89 |
| 6,294,800 B1 * | 9/2001 | Duggal et al. | .................. | 257/89 |
| 6,296,376 B1 * | 10/2001 | Kondo et al. | ................... | 362/310 |
| 6,560,038 B1 * | 5/2003 | Parkyn et al. | ................. | 359/726 |
| 6,580,097 B1 * | 6/2003 | Soules et al. | .................. | 257/100 |
| 6,803,719 B1 * | 10/2004 | Miller et al. | ................... | 313/501 |
| 6,914,265 B2 * | 7/2005 | Bawendi et al. | ................ | 257/98 |
| 7,005,679 B2 * | 2/2006 | Tarsa et al. | ....................... | 257/98 |
| 7,049,740 B2 * | 5/2006 | Takekuma | ..................... | 313/501 |
| 7,119,376 B1 * | 10/2006 | Liu et al. | ........................... | 257/98 |
| 7,227,190 B2 * | 6/2007 | Yasukawa et al. | ............... | 257/79 |
| 7,332,746 B1 * | 2/2008 | Takahashi et al. | .............. | 257/98 |
| 7,374,807 B2 * | 5/2008 | Parce et al. | ..................... | 428/76 |
| 7,420,219 B2 * | 9/2008 | Kang et al. | ...................... | 257/98 |
| 7,479,662 B2 * | 1/2009 | Soules et al. | ................... | 257/98 |
| 7,531,956 B2 * | 5/2009 | Kim et al. | ...................... | 313/503 |
| 7,592,639 B2 * | 9/2009 | Maeda et al. | .................... | 257/98 |

(Continued)

FOREIGN PATENT DOCUMENTS

CN            102047452 A     5/2011
CN            202009035 U    10/2011

*Primary Examiner* — Earl Taylor
(74) *Attorney, Agent, or Firm* — Novak Druce Connolly Bove + Quigg LLP

(57) ABSTRACT

An LED light source device includes an LED light source, a first translucent structure covering the LED light source and a second translucent structure covering the first translucent structure. An interior of the first translucent structure has light scattering powder distributed therein. The LED light source is embedded in the first translucent structure. The LED light source is covered by the light scattering powder. The second translucent structure has a radius of R and an index of refraction of $N_1$, while the first translucent structure has a radius of r, wherein R, r and $N_1$ satisfy the following relation: $N_1 < R/(2r-R)$.

9 Claims, 2 Drawing Sheets

(56) References Cited

U.S. PATENT DOCUMENTS

| | | | |
|---|---|---|---|
| 7,629,620 B2 * | 12/2009 | Maeda et al. | 257/98 |
| 7,658,866 B2 * | 2/2010 | Murazaki et al. | 252/301.4 R |
| 7,663,315 B1 * | 2/2010 | Hulse | 313/512 |
| 7,679,281 B2 * | 3/2010 | Kim et al. | 313/501 |
| 7,709,852 B2 * | 5/2010 | Hohn et al. | 257/98 |
| 7,710,016 B2 * | 5/2010 | Miki et al. | 313/502 |
| 7,745,818 B2 * | 6/2010 | Sofue et al. | 257/40 |
| 7,753,553 B2 * | 7/2010 | Justel et al. | 362/231 |
| 7,772,604 B2 * | 8/2010 | Duong et al. | 257/95 |
| 7,800,124 B2 * | 9/2010 | Urano et al. | 257/98 |
| RE41,807 E * | 10/2010 | Yokoi et al. | 600/129 |
| 7,828,453 B2 * | 11/2010 | Tran et al. | 362/84 |
| 7,858,997 B2 * | 12/2010 | Yoshimura et al. | 257/98 |
| 7,858,998 B2 * | 12/2010 | Negley | 257/98 |
| 7,923,918 B2 * | 4/2011 | Tamaki et al. | 313/503 |
| 7,960,909 B2 * | 6/2011 | Amano et al. | 313/504 |
| 7,985,015 B2 * | 7/2011 | Tasch et al. | 362/555 |
| 7,989,236 B2 * | 8/2011 | Yamaguchi et al. | 438/26 |
| 8,025,429 B2 * | 9/2011 | Ho et al. | 362/311.02 |
| 8,044,424 B2 * | 10/2011 | Urano et al. | 257/98 |
| 8,067,884 B2 * | 11/2011 | Li | 313/501 |
| 8,071,996 B2 * | 12/2011 | Hohn et al. | 257/98 |
| 8,125,139 B2 * | 2/2012 | Emoto et al. | 313/503 |
| 8,163,203 B2 * | 4/2012 | Im et al. | 252/301.4 R |
| 8,168,998 B2 * | 5/2012 | David et al. | 257/100 |
| 8,240,888 B2 * | 8/2012 | Zhang et al. | 362/311.06 |
| 8,272,768 B2 * | 9/2012 | Kazmierski et al. | 362/311.06 |
| 8,308,980 B2 * | 11/2012 | Lee et al. | 252/301.4 R |
| 8,318,044 B2 * | 11/2012 | Lee et al. | 252/301.4 R |
| 8,322,896 B2 * | 12/2012 | Falicoff et al. | 362/363 |
| 8,328,395 B2 * | 12/2012 | Kato et al. | 362/296.01 |
| 8,382,337 B2 * | 2/2013 | Ing et al. | 362/311.03 |
| 8,419,229 B2 * | 4/2013 | Dong | 362/311.02 |
| 8,430,538 B2 * | 4/2013 | Holder et al. | 362/311.02 |
| 8,449,150 B2 * | 5/2013 | Allen et al. | 362/311.06 |
| 8,511,864 B2 * | 8/2013 | Holder et al. | 362/311.02 |
| 8,536,608 B2 * | 9/2013 | David et al. | 257/98 |
| 8,545,061 B2 * | 10/2013 | Chang et al. | 362/311.06 |
| 8,547,009 B2 * | 10/2013 | Hussell et al. | 313/499 |
| 8,558,446 B2 * | 10/2013 | Miki et al. | 313/502 |
| 8,558,456 B2 * | 10/2013 | Yokotani | 313/512 |
| 8,562,161 B2 * | 10/2013 | Tong et al. | 362/84 |
| 8,569,944 B2 * | 10/2013 | Choi et al. | 313/501 |
| 8,573,815 B2 * | 11/2013 | Mallory et al. | 362/311.02 |
| 8,602,605 B2 * | 12/2013 | Park et al. | 362/311.02 |
| 8,616,734 B2 * | 12/2013 | Olsson | 362/311.02 |
| 8,624,289 B2 * | 1/2014 | Wirth | 257/100 |
| 8,641,238 B2 * | 2/2014 | Chiu et al. | 362/335 |
| 2004/0217692 A1 * | 11/2004 | Cho et al. | 313/503 |
| 2005/0052871 A1 * | 3/2005 | Leu et al. | 362/311 |
| 2005/0212397 A1 * | 9/2005 | Murazaki et al. | 313/487 |
| 2006/0226758 A1 * | 10/2006 | Sofue et al. | 313/483 |
| 2008/0143246 A1 * | 6/2008 | Hirosaki et al. | 313/503 |
| 2008/0246044 A1 * | 10/2008 | Pang | 257/98 |
| 2009/0189507 A1 * | 7/2009 | Winkler et al. | 313/484 |
| 2009/0200939 A1 * | 8/2009 | Lenk et al. | 313/512 |
| 2009/0272996 A1 * | 11/2009 | Chakraborty | 257/98 |
| 2010/0084962 A1 * | 4/2010 | Winkler et al. | 313/484 |
| 2010/0123386 A1 * | 5/2010 | Chen | 313/502 |
| 2010/0140551 A1 * | 6/2010 | Parce et al. | 252/301.36 |
| 2010/0181582 A1 * | 7/2010 | Li et al. | 257/91 |
| 2010/0194263 A1 * | 8/2010 | Winkler et al. | 313/486 |
| 2010/0201250 A1 * | 8/2010 | Winkler et al. | 313/486 |
| 2010/0232134 A1 * | 9/2010 | Tran | 362/84 |
| 2010/0308356 A1 * | 12/2010 | Wirth | 257/98 |
| 2011/0001422 A1 * | 1/2011 | Aanegola et al. | 313/501 |
| 2011/0006329 A1 * | 1/2011 | Fujita et al. | 257/98 |
| 2011/0045619 A1 * | 2/2011 | Ling | 438/29 |
| 2011/0069496 A1 * | 3/2011 | Ing et al. | 362/311.02 |
| 2011/0085352 A1 | 4/2011 | Ito et al. | |
| 2011/0133220 A1 * | 6/2011 | Kim et al. | 257/88 |
| 2011/0149580 A1 * | 6/2011 | Fu et al. | 362/311.02 |
| 2011/0180780 A1 * | 7/2011 | Yoo et al. | 257/13 |
| 2011/0215700 A1 * | 9/2011 | Tong et al. | 313/46 |
| 2011/0216523 A1 * | 9/2011 | Tong et al. | 362/84 |
| 2011/0227475 A1 * | 9/2011 | Winkler et al. | 313/484 |
| 2011/0248287 A1 * | 10/2011 | Yuan et al. | 257/88 |
| 2011/0273083 A1 * | 11/2011 | Yun et al. | 313/506 |
| 2011/0279011 A1 * | 11/2011 | Murphy et al. | 313/483 |
| 2011/0279022 A1 * | 11/2011 | Winkler et al. | 313/504 |
| 2011/0304261 A1 * | 12/2011 | Winkler et al. | 313/503 |
| 2011/0309398 A1 * | 12/2011 | Ito et al. | 257/98 |
| 2011/0316032 A1 * | 12/2011 | Ooyabu et al. | 257/98 |
| 2012/0018754 A1 * | 1/2012 | Lowes | 257/98 |
| 2012/0057327 A1 * | 3/2012 | Le et al. | 362/84 |
| 2012/0068118 A1 * | 3/2012 | Parce et al. | 252/301.36 |
| 2012/0212959 A1 * | 8/2012 | Inoue et al. | 362/249.01 |
| 2013/0285094 A1 * | 10/2013 | Hsu et al. | 257/98 |

* cited by examiner

LIGHT EMITTING DIODE LIGHT SOURCE DEVICE

BACKGROUND

1. Technical Field

The present disclosure relates to an LED (light emitting diode) light source device, and more particularly to an LED light source device having a uniform light distribution and a large viewing angle.

2. Description of Related Art

LEDs have been widely promoted as light sources of electronic devices owing to many advantages, such as high luminosity, low operational voltage and low power consumption. However, as a point light source, a viewing angle of the LED is only about 120°, and a light field of the LED is not uniform.

Therefore, an LED light source device capable of overcoming the above described shortcomings is desired.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
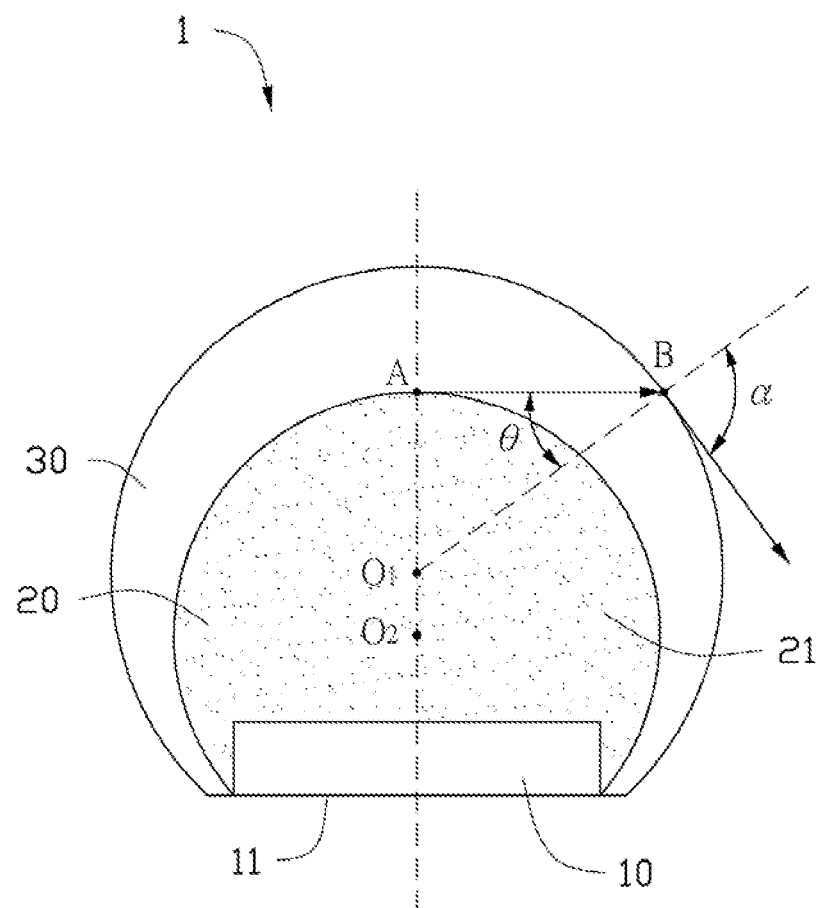
FIG. 1 shows a schematic view of an LED light source device in accordance with an embodiment of the present disclosure.

Referring to FIG. 1, an LED light source device 1 in accordance with an exemplary embodiment of the present disclosure includes an LED light source 10, a first translucent structure 20 covering the LED light source 10, and a second translucent structure 30 covering the first translucent structure 20.

In this embodiment, the LED light source 10 is an LED package, and includes a bottom surface 11. The LED light source 10 can also be an LED chip.

Figure 2:
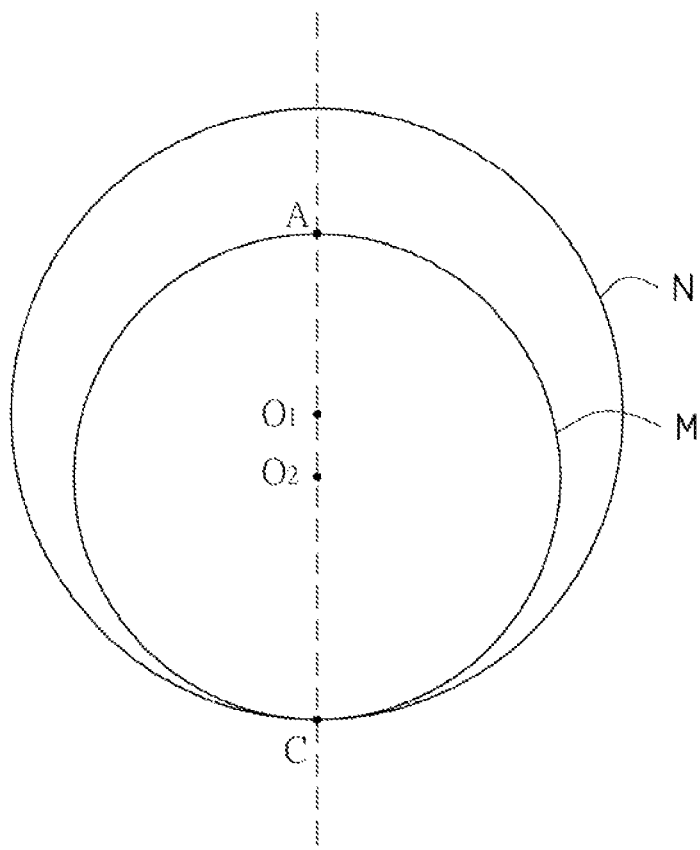
FIG. 2 shows a geometric diagram of a first translucent structure and a second translucent structure of the LED light source device illustrated in FIG. 1 of the present disclosure.

The first translucent structure 20 is located on a light path of the LED light source 10, and a kind of powder 21 with a characteristic of scattering light is distributed in an interior of the whole first translucent structure 20 evenly. Referring to FIG. 2, in this embodiment, the first translucent structure 20 is partly spherical. The LED light source 10 is embedded in the first translucent structure 20, merely with the bottom surface 11 exposed outside and coplanar with a bottom edge of the first translucent structure 20. Alternatively, the LED light source 10 can also be located outside of the first translucent structure 20, and the powder 21 can also be merely coated at an outer surface of the first translucent structure 20.

The second translucent structure 30 covers the first translucent structure 20 therebelow, and attaches to an outer surface of the first translucent structure 20. In this embodiment, the second translucent structure 30 is a lens, and the outer contour of the second translucent structure 30 is partly spherical. The first translucent structure 20 is embedded in the second translucent structure 30, and the bottom surface 11 of the LED light source 10 is coplanar with a bottom edge the second translucent structure 30. The index of refraction of the second translucent structure 30 is represented by $N_1$.

Referring to FIG. 2, it shows a geometric diagram of the first translucent structure 20 and the second translucent structure 30. Sphere M and sphere N are defined, and the centers and radius of the sphere M and sphere N are illustrated and represented by point $O_2$, point $O_1$, r and R, respectively, and R>r. The sphere M is internally tangent with the sphere N at a point C. An outer contour of the first translucent structure 20 is coincident with a part of the sphere M, and an outer contour of the second translucent structure 30 is coincident with a part of the sphere N. The point C is located on an extension line of $O_1 O_2$ and away from the point $O_1$. The extension line of $O_1 O_2$ and the sphere M intersect at a point A. The LED light source 10 is located on the extension line of $O_1 O_2$, and above the point C.

During operation of the LED light source 10, the light emitted from the LED light source 10 travels toward the first translucent structure 20. Under light scattering of the powder 21, the light output by the first translucent structure 20 will enter the second transparent structure 30 along various travelling directions. Therefore, the viewing angle of the LED light source device 1 is increased, and the light field of the LED light source device 1 is modified to be uniform. When light travelling from the point A to a point B on the outer contour of the second translucent structure 30, along a direction perpendicular to the line $O_1 O_2$, strikes onto the outer contour of the second translucent structure 30, an incident angle thereof is defined as $\theta$. A critical angle of total reflection of the outer contour of the second translucent structure 30 is defined as $\beta$. When $\theta$ is equal to $\beta$, an angle of refraction $\alpha$ will be 90° and the light will be output. When $\theta>\beta$, the light will be reflected back into the interior of the second translucent structure 30 without being output. When $\theta<\beta$, $\alpha<90°$, the light will be totally output. According to the law of refraction of light, $N_1 \sin \theta = \sin \alpha < \sin 90° = 1$ is obtained. $N_1$ is the index of refraction of the second translucent structure 30.

Referring to FIG. 2, $\sin \theta = (2r-R)/R$ is known. Therefore, $N_1 (2r-R)/R < 1$, and $N_1 < R/(2r-R)$ is obtained. Therefore, when $N_1 < R/(2r-R)$, the light can pass through the second translucent structure 30 to ambient air, avoiding the incident angle $\theta$ too large and the light reflecting back into the interior of the second translucent structure 30 repetitively without being output. Therefore, the light loss is low, and the efficiency of utilization of the light is enhanced.

For the first translucent structure 20 and the second translucent structure 30 covering the LED light source 10, and powder 21 having a characteristic of scattering light being distributed in the interior of the first translucent structure 20, the light travels outward via the first translucent structure 20 and the second translucent structure 30 along various travelling directions. Therefore, the light-emitting angle of the LED light source device 1 is increased, and a light intensity distribution of the light field of the LED light source device 1 is uniform.

Additionally, the powder 21 can be made of a single color phosphor material, or made of multi-color phosphor materials. The powder 21 can also be alternately a mixture of phosphor materials and powder materials, such as $SiO_2$, $Al_2O_3$ or silicate.

Additionally, the embodiment of the present disclosure can also be understood as that, the second translucent structure 30 is directly filled with the powder 21, without the first translucent structure 20. A radius of a sphere of the second translucent structure 30 is R, and a radius of the sphere of the powder 21 filled in the second translucent structure 30 is r, and the LED light source 10 is embedded in the powder 21.

FIGS. 1 and 2 only succinctly illustrate the scattering paths of the light emitted from the LED light source 10, without introducing other structures of the LED light source device 1. Thus, the LED light source device 1 can also include other unmentioned structures, such as a lamp holder.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. An LED light source device, comprising:
   an LED light source;
   a first translucent structure covering the LED light source, powder with a characteristic of scattering light being distributed in an interior of the first translucent structure, the LED light source being embedded in the first translucent structure and covered by the powder; and
   a second translucent structure covering the first translucent structure;
   wherein an outer contour of the first translucent structure and an outer contour of the second translucent structure are both partly spherical, the outer contour of the first translucent structure is coincident with a part of a first sphere, the outer contour of the second translucent structure is coincident with a part of a second sphere, and radiuses of the first sphere and the second sphere satisfy following condition: R>r, wherein r represents radius of the first sphere, R represents radius of the second sphere, and the first sphere for which the outer contour of the first translucent structure is partly coincidental is internally tangent with the second sphere for which the outer contour of the second translucent structure is partly coincidental, and wherein the index of refraction of the second translucent structure satisfies following condition: $N_1 < R/(2r-R)$, wherein $N_1$ represents the index of refraction of the second translucent structure.

2. The LED light source device of claim 1, wherein the LED light source is located on an extension line of a connecting line of the centers of the first translucent structure and the second translucent.

3. The LED light source device of claim 1, wherein the powder is made of phosphor materials.

4. The LED light source device of claim 1, wherein the powder is a mixture of phosphor materials and powder materials which include $SiO_2$, $Al_2O_3$ or silicate.

5. The LED light source device of claim 1, wherein the powder is distributed in the interior of the whole first translucent structure evenly.

6. An LED light source device, comprising:
   an LED light source;
   a translucent structure located on a light path of the LED light source;
   powder filled in an interior of the translucent structure, the powder having a characteristic of scattering light; and
   wherein the LED light source is embedded in the translucent structure;
   wherein an outer contour of the translucent structure and an outer contour of the powder are both partly spherical, and the outer contour of the powder is coincident with a part of a first sphere, the outer contour of the translucent structure is coincident with a part of a second sphere, and radiuses of the first sphere and the second sphere satisfy following condition: R>r, wherein r represents radius of the first sphere, R represents radius of the second sphere, and the first sphere for which the outer contour of the powder is partly coincidental is internally tangent with the second sphere for which the outer contour of the translucent structure is partly coincidental; and wherein the index of refraction of the translucent structure satisfies following condition: $N_1 < R/(2r-R)$, wherein $N_1$ represents the index of refraction of the translucent structure.

7. The LED light source device of claim 6, wherein the LED light source is located on an extension line of a connecting line of the centers of the translucent structure and the powder.

8. The LED light source device of claim 6, wherein the powder is made of phosphor materials.

9. The LED light source device of claim 6, wherein the powder is a mixture of phosphor materials and powder materials which include $SiO_2$, $Al_2O_3$ or silicate.

* * * * *